(12) United States Patent
Shin et al.

(10) Patent No.: US 11,227,914 B2
(45) Date of Patent: Jan. 18, 2022

(54) SEMICONDUCTOR DEVICE

(71) Applicant: SAMSUNG ELECTRONICS CO., LTD., Suwon-si (KR)

(72) Inventors: Woo Cheol Shin, Seoul (KR); Sun Wook Kim, Yongin-si (KR); Seung Min Song, Hwaseong-si (KR); Nam Hyun Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 15 days.

(21) Appl. No.: 16/776,677

(22) Filed: Jan. 30, 2020

(65) Prior Publication Data

US 2021/0036106 A1 Feb. 4, 2021

(30) Foreign Application Priority Data

Jul. 29, 2019 (KR) .................. 10-2019-0091531

(51) Int. Cl.
| | |
|---|---|
| *H01L 29/06* | (2006.01) |
| *H01L 29/10* | (2006.01) |
| *H01L 29/08* | (2006.01) |
| *H01L 29/423* | (2006.01) |
| *H01L 27/092* | (2006.01) |

(52) U.S. Cl.
CPC ...... *H01L 29/0673* (2013.01); *H01L 27/0924* (2013.01); *H01L 29/0847* (2013.01); *H01L 29/1037* (2013.01); *H01L 29/42392* (2013.01)

(58) Field of Classification Search
CPC ......... H01L 27/0886; H01L 21/823431; H01L 29/4238; H01L 29/785; H01L 29/0673; H01L 21/823468; H01L 29/42392; H01L 29/78696; H01L 29/7853; H01L 29/7855; H01L 27/0922; H01L 27/0924; H01L 29/0638; H01L 29/0684; H01L 21/823821; H01L 29/66795; H01L 29/7848; H01L 29/7845; H01L 21/823418; H01L 21/02532; H01L 29/1037; H01L 29/0847; H01L 29/78; H01L 29/0603; H01L 29/66477; H01L 27/0207; H01L 21/02603; H01L 21/0217; H01L 21/823814; H01L 21/823864
See application file for complete search history.

(56) References Cited

U.S. PATENT DOCUMENTS

| | | | |
|---|---|---|---|
| 8,187,961 | B2 | 5/2012 | Doris et al. |
| 9,653,289 | B1 | 5/2017 | Balakrishnan et al. |
| 10,069,015 | B2 | 9/2018 | Cheng et al. |
| 10,177,235 | B2 | 1/2019 | Balakrishnan et al. |

(Continued)

*Primary Examiner* — Jonathan Han
(74) *Attorney, Agent, or Firm* — Lee IP Law, PC

(57) ABSTRACT

A semiconductor device includes a substrate having a first region and a second region, first and second nanowires disposed sequentially on the substrate in the first region, and extending respectively in a first direction, third and fourth nanowires disposed sequentially on the substrate in the second region, and extending respectively in the first direction, a first inner spacer between the first nanowire and the second nanowire, and including hydrogen of a first hydrogen mole fraction, and a second inner spacer between the third nanowire and the fourth nanowire, and including hydrogen of a second hydrogen mole fraction that is greater than the first hydrogen mole fraction.

20 Claims, 12 Drawing Sheets

(56) References Cited

U.S. PATENT DOCUMENTS

| | | |
|---|---|---|
| 10,181,510 B2 | 1/2019 | Yang et al. |
| 10,229,971 B1 * | 3/2019 | Cheng .................. H01L 29/401 |
| 2017/0256609 A1 * | 9/2017 | Bhuwalka ............. H01L 29/775 |
| 2017/0365604 A1 * | 12/2017 | Suh ................. H01L 21/823807 |
| 2018/0175035 A1 | 6/2018 | Yang et al. |
| 2018/0190544 A1 | 7/2018 | Bi et al. |
| 2018/0323111 A1 | 11/2018 | Cheng et al. |
| 2018/0351002 A1 | 12/2018 | Cheng et al. |
| 2018/0358436 A1 * | 12/2018 | Jambunathan ...... H01L 29/0847 |

\* cited by examiner

FIG. 6
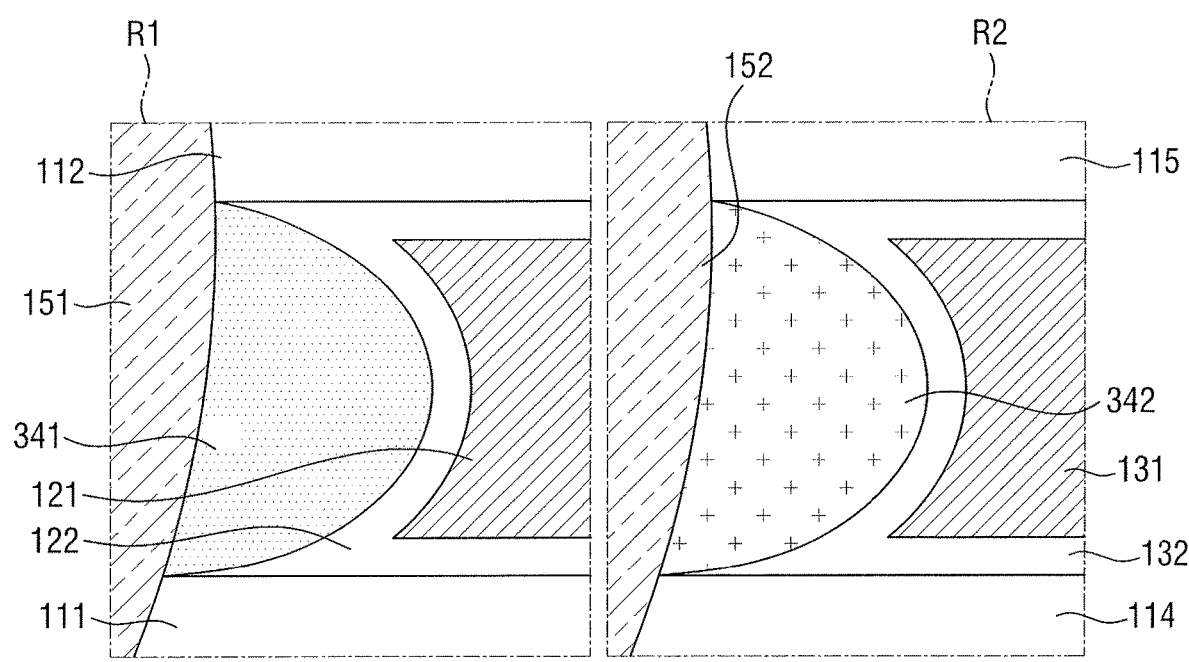
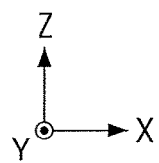

SEMICONDUCTOR DEVICE

CROSS-REFERENCE TO RELATED APPLICATION

Korean Patent Application No. 10-2019-0091531, filed on Jul. 29, 2019, in the Korean Intellectual Property Office, and entitled: "Semiconductor Device," is incorporated by reference herein in its entirety.

BACKGROUND

1. Field

Embodiments relate to a semiconductor device.

2. Description of the Related Art

A multigate transistor has been suggested as one of the scaling technologies to increase density of semiconductor devices, in which a silicon body in a fin or nanowire shape is formed on a substrate with gates then are formed on a surface of the silicon body.

Such a multigate transistor allows easy scaling, as it uses a three-dimensional channel. Further, current control capability can be enhanced without requiring increased gate length of the multigate transistor. Not only that, it is possible to effectively inhibit the short channel effect (SCE) in which the electric potential of a channel region is affected by a drain voltage.

SUMMARY

Embodiments are directed to a semiconductor device, including a substrate having a first region and a second region, first and second nanowires disposed sequentially on the substrate in the first region, and extending respectively in a first direction, third and fourth nanowires disposed sequentially on the substrate in the second region, and extending respectively in the first direction, a first inner spacer between the first nanowire and the second nanowire, and including hydrogen of a first hydrogen mole fraction, and a second inner spacer between the third nanowire and the fourth nanowire, and including hydrogen of a second hydrogen mole fraction that is greater than the first hydrogen mole fraction.

Embodiments are also directed to a semiconductor device, including a substrate having a first region and a second region, first and second nanowires disposed sequentially on the substrate in the first region and extending respectively in a first direction, third and fourth nanowires disposed sequentially on the substrate in the second region and extending respectively in the first direction, a first gate electrode surrounding the first and second nanowires and extending in a second direction different from the first direction, a second gate electrode surrounding the third and fourth nanowires and extending in the second direction, a first inner spacer on at least one side of the first gate electrode between the first nanowire and the second nanowire, and including oxygen of a first oxygen mole fraction, and a second inner spacer on at least one side of the second gate electrode between the third nanowire and the fourth nanowire, and including oxygen of a second oxygen mole fraction that is greater than the first oxygen mole fraction.

Embodiments are also directed to a semiconductor device, including a substrate having a first region and a second region, first to third nanowires disposed sequentially on the substrate in the first region and extending respectively in a first direction, fourth to sixth nanowires disposed sequentially on the substrate in the second region and extending respectively in the first direction, a first gate electrode surrounding the first to third nanowires and extending in a second direction different from the first direction, a second gate electrode surrounding the fourth to sixth nanowires and extending in the second direction, a first source/drain region on at least one side of the first to third nanowires, a second source/drain region on at least one side of the fourth to sixth nanowires, a first inner spacer on at least one side of the first gate electrode between the first nanowire and the second nanowire, and including oxygen of a first oxygen mole fraction and hydrogen of a first hydrogen mole fraction, a second inner spacer on at least one side of the second gate electrode between the fourth nanowire and the fifth nanowire, and including oxygen of a second oxygen mole fraction that is greater than the first oxygen mole fraction, and hydrogen of a second hydrogen mole fraction that is greater than the first hydrogen mole fraction, a first source/drain contact connected with the first source/drain region, and a second source/drain contact connected with the second source/drain region.

BRIEF DESCRIPTION OF THE DRAWINGS

Features will become apparent to those of skill in the art by describing in detail example embodiments with reference to the attached drawings, in which:

FIG. 6 illustrates an enlarged view of a region R1 and a region R2 of FIG. 2 according to another example embodiment;

DETAILED DESCRIPTION

Figure 1:
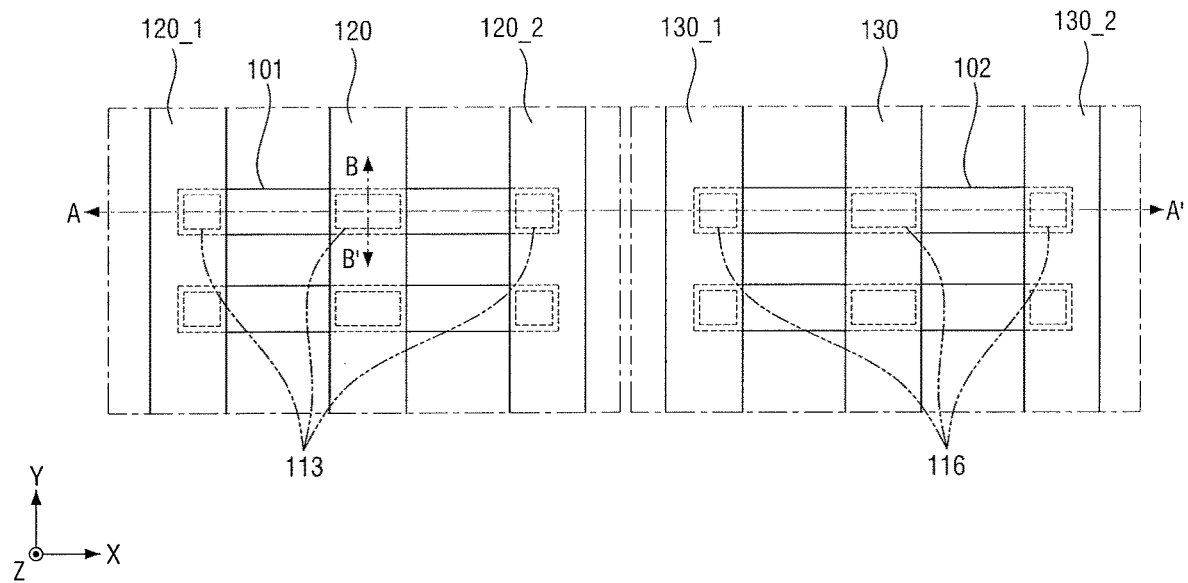
FIG. 1 illustrates a schematic top view of a semiconductor device according to an example embodiment.
Figure 2:
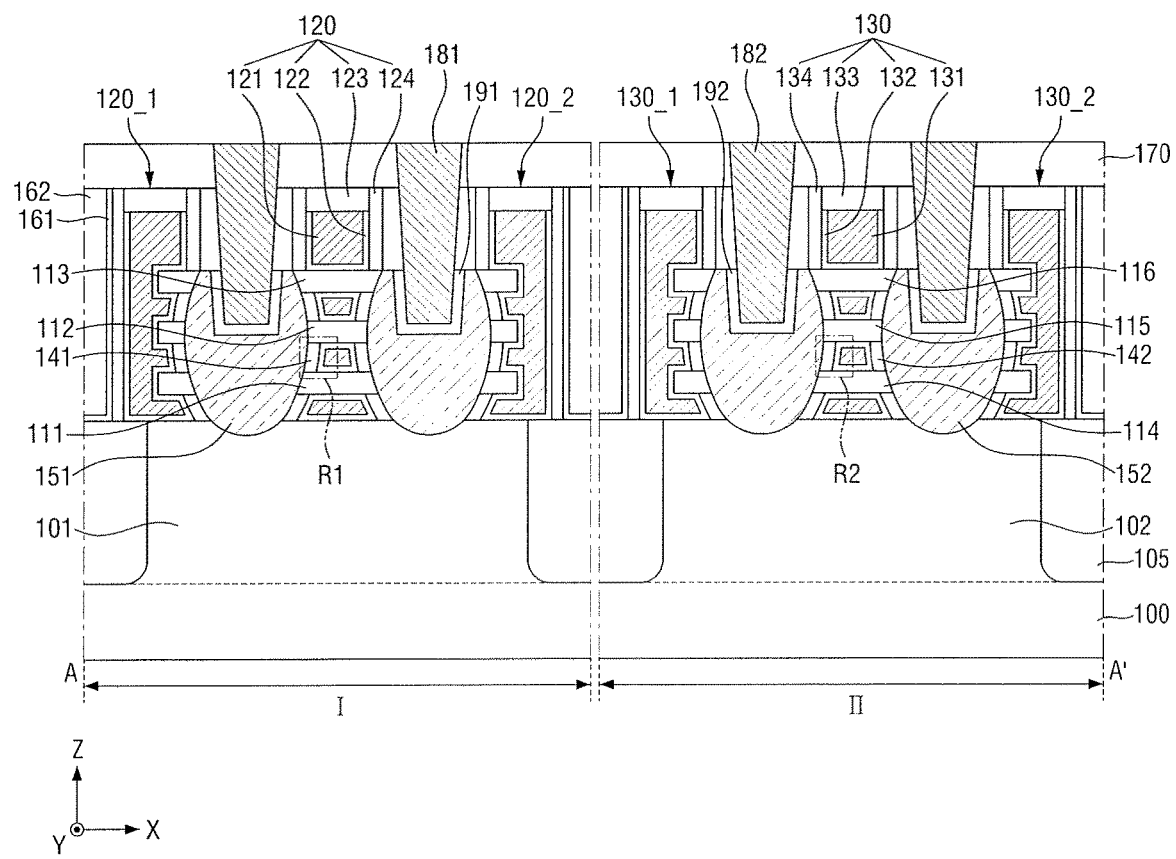
FIG. 2 illustrates a cross-sectional view taken along line A-A' of FIG. 1.
Figure 3:
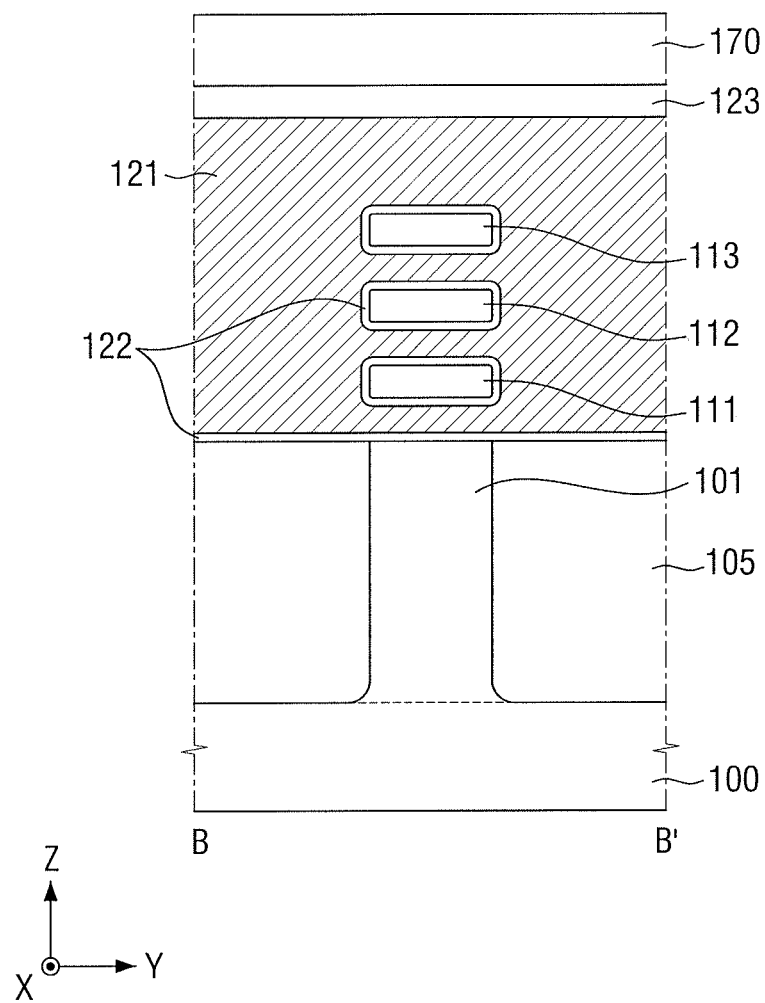
FIG. 3 illustrates a cross-sectional view taken along line B-B' of FIG. 1.
Figure 4:
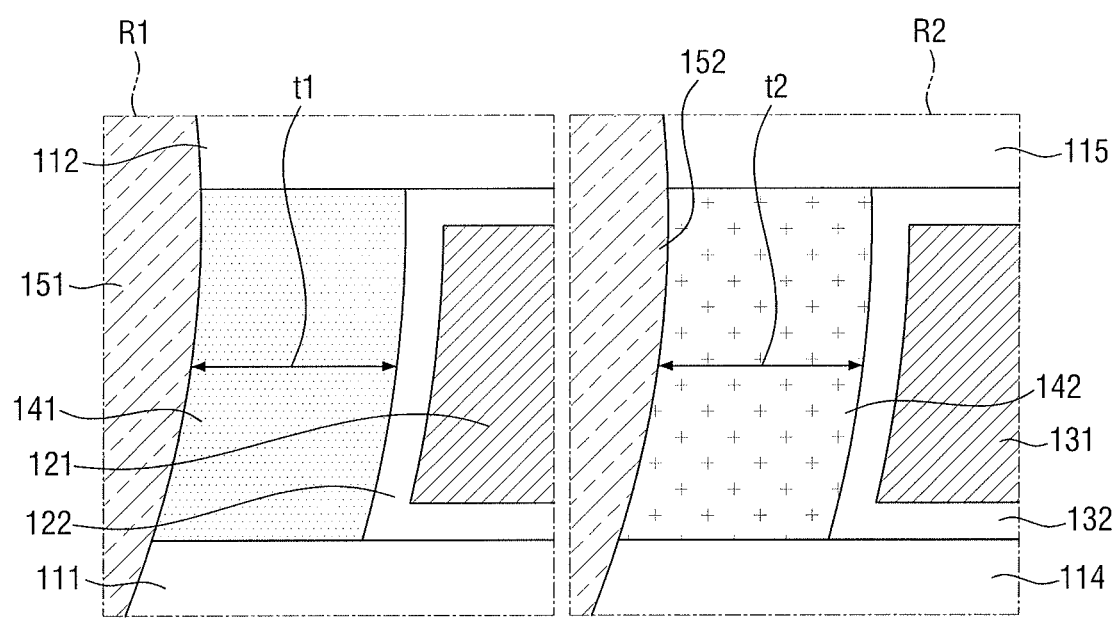
FIG. 4 illustrates an enlarged view of a region R1 and a region R2 of FIG. 2.

Hereinbelow, a semiconductor device according to an example embodiment will be described with reference to FIGS. 1 to 4. FIG. 1 is a schematic top view. FIG. 2 is a cross-sectional view taken along line A-A' of FIG. 1. FIG. 3 is a cross-sectional view taken along line B-B' of FIG. 1. FIG. 4 is an enlarged view of a region R1 and a region R2 of FIG. 2.

Referring to FIGS. 1 to 4, the semiconductor device according to an example embodiment includes a substrate 100, a device isolation film 105, a first lower pattern 101, a second lower pattern 102, first to sixth nanowires 111, 112, 113, 114, 115, 116, a first gate structure 120, a second gate structure 130, first to fourth pin-cut gate structures 120_1, 120_2, 130_1, 130_2, a first source/drain region 151, a second source/drain region 152, a first interlayer insulating film 162, a second interlayer insulating film 170, a first source/drain contact 181, a second source/drain contact 182, a first silicide film 191, and a second silicide film 192. (For convenience of explanation, FIG. 1 does not illustrate the first interlayer insulating film 162, the second interlayer insulating film 170, the first source/drain contact 181, or the second source/drain contact 182.)

The substrate 100 may be, for example, bulk silicon or a silicon-on-insulator (SOI). In an implementation, the substrate 100 may be a silicon substrate, or may include other materials such as silicon germanium, silicon germanium on insulator (SGOI), indium antimonide, lead telluride, indium arsenide, indium phosphide, gallium arsenide, gallium antimonide, etc.

On the substrate 100, a first region I and a second region II may be defined. The first region I may include the first lower pattern 101, and the second region II may include the second lower pattern 102. The first region I may be, for example, an NMOS region, and the second region II may be, for example, a PMOS region.

The threshold voltage in the first region I and the second region II may be different from each other. For example, a threshold voltage of the first region I may be more than that of the second region II.

The first lower pattern 101 and the second lower pattern 102 may respectively protrude from the substrate 100. The first lower pattern 101 and the second lower pattern 102 may extend longitudinally in a first direction X, respectively. The first lower pattern 101 and the second lower pattern 102 may be aligned in the first direction X as a length direction. The first lower pattern 101 and the second lower pattern 102 may be spaced apart from each other in the first direction X.

The first lower pattern 101 and the second lower pattern 102 may be respectively formed by etching a portion of the substrate 100, and may include an epitaxial layer grown from the substrate 100.

The first lower pattern 101 and the second lower pattern 102 may have a pin-type pattern shape, for example. The first lower pattern 101 and the second lower pattern 102 may be isolated by the device isolation film 105.

The device isolation film 105 may be disposed on the substrate 100. The device isolation film 105 may be disposed on sidewalls of the first lower pattern 101 and the second lower pattern 102. The device isolation film 105 may include, for example, at least one of a silicon oxide film, a silicon nitride film, or a silicon oxynitride film.

FIG. 2 illustrates an example in which three nanowires 111, 112, 113 are stacked sequentially on the substrate 100 in the first region I, and other three nanowires 114, 115, 116 are stacked sequentially on the substrate 100 in the second region II. According to another example embodiment, a number of nanowires disposed on the substrate 100 in the first region I may be different from the above, and a number of nanowires disposed on the substrate 100 in the second region II may be also different from the above.

The first to third nanowires 111, 112, 113 may be spaced apart from one another sequentially in a third direction Z on the substrate 100 in the first region I, where Z is a thickness direction of the substrate 100. For example, the first nanowire 111 may be disposed on the substrate 100 in the first region I to be spaced apart therefrom in the third direction Z. The second nanowire 112 may be disposed on the first nanowire 111 to be spaced apart therefrom in the third direction Z. The third nanowire 113 may be disposed on the second nanowire 112 to be spaced apart therefrom in the third direction Z.

Each of the first to third nanowires 111, 112, 113 may extend in the first direction X. Each of the first to third nanowires 111, 112, 113 may be used as a channel region of the NMOS transistor. Each of the first to third nanowires 111, 112, 113 may include, for example, a material having high mobility for electrons.

The fourth to sixth nanowires 114, 115, 116 may be disposed on the substrate 100 in the second region II to be spaced apart from one another sequentially in the third direction Z. For example, the fourth nanowire 114 may be disposed on the substrate 100 in the second region II to be spaced apart therefrom in the third direction Z. The fifth nanowire 115 may be disposed on the fourth nanowire 114 to be spaced apart therefrom in the third direction Z. The sixth nanowire 116 may be disposed on the fifth nanowire 115 to be spaced apart therefrom in the third direction Z.

The fourth to sixth nanowires 114, 115, 116 may extend in the first direction X, respectively. Each of the fourth to sixth nanowires 114, 115, 116 may be used as a channel region of the PMOS transistor. Each of the fourth to sixth nanowires 114, 115, 116 may include, for example, a material having high mobility for holes.

The first nanowire 111 may be disposed on a same level as that of the fourth nanowire 114. The second nanowire 112 may be disposed on a same level as that of the fifth nanowire 115. The third nanowire 113 may be disposed on a same level as that of the sixth nanowire 116.

The first gate structure 120 may be disposed on the substrate 100 in the first region I. The first gate structure 120 may extend in a second direction Y and intersect with the first lower pattern 101.

The first pin-cut gate structure 120_1 may be spaced apart in the first direction X from the first gate structure 120 on the substrate 100 in the first region I. The first pin-cut gate structure 120_1 may extend in the second direction Y and intersect with the first lower pattern 101.

The second pin-cut gate structure 120_2 may be spaced apart in the first direction X from the first gate structure 120 on the substrate 100 in the first region I. The second pin-cut gate structure 120_2 may extend in the second direction Y and intersect with the first lower pattern 101. The first gate structure 120 may be disposed between the first pin-cut gate structure 120_1 and the second pin-cut gate structure 120_2.

The first gate structure 120 may entirely overlap the first lower pattern 101. Each of the first pin-cut gate structure 120_1 and the second pin-cut gate structure 120_2 may overlap a portion of the first lower pattern 101. For example, a width in the first direction X where the first gate structure 120 intersects with the first lower pattern 101 may be same as a width in the first direction X of the first gate structure 120. A width in the first direction X where the first pin-cut gate structure 120_1 intersects with the first lower pattern 101 may be less than a width in the first direction X of the first pin-cut gate structure 120_1. A width in the first direction X where the second pin-cut gate structure 120_2 intersects with the first lower pattern 101 may be less than a width in the first direction X of the second pin-cut gate structure 120_2.

The first gate structure 120 may surround the first to third nanowires 111, 112, 113. The first pin-cut gate structure 120_1 may surround, e.g., entirely surround, an end of each of the first to third nanowires 111, 112, 113. The second pin-cut gate structure 120_2 may entirely surround another end of each of the first to third nanowires 111, 112, 113, which other end opposes the end of each of the first to third nanowires 111, 112, 113 surrounded by the first pin-cut gate structure 120_1.

The first source/drain region 151 may be disposed between the first to third nanowires 111, 112, 113 surrounded by the first gate structure 120 and the first to third nanowires 111, 112, 113 surrounded by the first pin-cut gate structure 120_1. Further, the first source/drain region 151 may be disposed between the first to third nanowires 111, 112, 113 surrounded by the first gate structure 120 and the first to third nanowires 111, 112, 113 surrounded by the second pin-cut gate structure 120_2.

The second gate structure 130 may be disposed on the substrate 100 in the second region II. The second gate structure 130 may extend in the second direction Y and intersect with the second lower pattern 102.

The third pin-cut gate structure 1301 may be spaced apart in the first direction X from the second gate structure 130 on the substrate 100 in the second region II. The third pin-cut gate structure 1301 may extend in the second direction Y and intersect with the second lower pattern 102.

The fourth pin-cut gate structure 130_2 may be spaced apart in the first direction X from the second gate structure 130 on the substrate 100 in the second region II. The fourth pin-cut gate structure 130_2 may extend in the second direction Y and intersect with the second lower pattern 102. The second gate structure 130 may be disposed between the third pin-cut gate structure 130_1 and the fourth pin-cut gate structure 1302.

The second gate structure 130 may entirely overlap the second lower pattern 102. Each of the third pin-cut gate structure 130_1 and the fourth pin-cut gate structure 130_2 may overlap a portion of the second lower pattern 102. For example, a width in the first direction X where the second gate structure 130 intersects with the second lower pattern 102 may be same as a width in the first direction X of the second gate structure 130. A width in the first direction X where the third pin-cut gate structure 130_1 intersects with the second lower pattern 102 may be less than a width in the first direction X of the third pin-cut gate structure 130_1. A width in the first direction X where the fourth pin-cut gate structure 130_2 intersects with the second lower pattern 102 may be less than a width in the first direction X of the fourth pin-cut gate structure 130_2.

The second gate structure 130 may surround the fourth to sixth nanowires 114, 115, 116. The third pin-cut gate structure 130_1 may surround, e.g., entirely surround, an end of each of the fourth to sixth nanowires 114, 115, 116. The fourth pin-cut gate structure 130_2 may surround, e.g., entirely surround, another end of each of the fourth to sixth nanowires 114, 115, 116, which other end opposes the end of each of the fourth to sixth nanowires 114, 115, 116 surrounded by the third pin-cut gate structure 130_1.

The second source/drain region 152 may be disposed between the fourth to sixth nanowires 114, 115, 116 surrounded by the second gate structure 130 and the fourth to sixth nanowires 114, 115, 116 surrounded by the third pin-cut gate structure 130_1. Further, the second source/drain region 152 may be disposed between the fourth to sixth nanowires 114, 115, 116 surrounded by the second gate structure 130 and the fourth to sixth nanowires 114, 115, 116 surrounded by the fourth pin-cut gate structure 1302.

Each of the first gate structure 120, the first pin-cut gate structure 120_1 and the second pin-cut gate structure 1202 may include a first gate electrode 121, a first gate insulating film 122, a first capping pattern 123, a first outer spacer 124, and a first inner spacer 141.

Each of the second gate structure 130, the third pin-cut gate structure 1301, and the fourth pin-cut gate structure 1302 may include a second gate electrode 131, a second gate insulating film 132, a second capping pattern 133, a second outer spacer 134, and a second inner spacer 142.

Hereinbelow, the first gate structure 120, the first pin-cut gate structure 120_1, and the second pin-cut gate structure 120_2 will be described. Description relating to the second gate structure 130, the third pin-cut gate structure 130_1, and the fourth pin-cut gate structure 1302 may be easily understood from the description relating to the first gate structure 120, the first pin-cut gate structure 120_1, and the second pin-cut gate structure 120_2.

The first gate electrode 121 may extend in the second direction Y on the substrate 100 in the first region I. The first gate electrode 121 may surround each of the first to third nanowires 111, 112, 113.

The first gate electrode 121 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiACN), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof. The first gate electrodes 121 may respectively include conductive metal oxide, conductive metal oxynitride, or the like, or an oxidized form of the aforementioned material.

The first gate insulating film 122 may be disposed along both sidewalls and a bottom surface of the first gate electrode 121. The first gate insulating film 122 may be disposed between the substrate 100 in the first region I and the first gate electrode 121, between the device isolation film 105 and the first gate electrode 121, between the first nanowire 111 and the first gate electrode 121, between the second nanowire 112 and the first gate electrode 121, and between the third nanowire 113 and the first gate electrode 121. Further, the first gate insulating film 122 may be disposed between the first inner spacer 141 and the first gate electrode 121, and between the first outer spacer 124 and the first gate electrode 121.

The first gate insulating film 122 may contain at least one of silicon oxide, silicon oxynitride, silicon nitride, and a high-k dielectric material (i.e., having a dielectric constant higher than silicon oxide). For example, the high-k dielectric material may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The first capping pattern 123 may be disposed on the first gate electrode 121. Although it is illustrated that the first gate insulating film 122 is not disposed between the first outer spacer 124 and the first capping pattern 123, this is provided only for convenience of explanation.

Although FIG. 2 illustrates that the first capping pattern 123 is formed between an inner side wall of the first outer spacer 124, according to another example embodiment, an upper surface of the first outer spacer 124 may be recessed to be lower than an upper surface of the first interlayer insulating film 162 as in the first gate electrode 121. In this case, the first capping pattern 123 may be disposed on an upper surface of the first outer spacer 124 and an upper surface of the first gate electrode 121.

An upper surface of the first capping pattern 123 may be formed on a same plane as an upper surface of the first interlayer insulating film 162. The first capping pattern 123 may include, for example, a material having etch selectivity to the first interlayer insulating film 162. For example, the first capping pattern 123 may include at least one of silicon nitride (SiN), silicon oxynitride (SiON), silicon oxide (SiO$_2$), silicon carbonitride (SiCN), silicon oxycarbonitride (SiOCN), and a combination thereof.

The first outer spacer 124 may extend in the second direction Y along a sidewall of the first gate electrode 121 on the third nanowire 113. The first outer spacer 124 may intersect with the first to third nanowires 111, 112, 113.

A portion of the first outer spacer 124 included in the first pin-cut gate structure 120_1 may extend in the second direction Y along a sidewall of the first gate electrode 121 on the device isolation film 105. Further, a portion of the first outer spacer 124 included in the second pin-cut gate structure 120_2 may extend in the second direction Y along a sidewall of the first gate electrode 121 on the device isolation film 105.

Although FIG. 2 illustrates that the first outer spacer 124 is formed as a single film, according to another example embodiment, the first outer spacer 124 may be formed as a multi-layered film.

The first outer spacer 124 may include, for example, at least one of silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC), and a combination thereof.

The first source/drain region 151 may be disposed between the first gate structure 120 and the first pin-cut gate structure 120_1, and between the first gate structure 120 and the second pin-cut gate structure 120_2, respectively. The first source/drain region 151 may be disposed on the first lower pattern 101. The first source/drain region 151 may be in direct contact with the first to third nanowires 111, 112, 113, respectively.

An upper surface of the first source/drain region 151 may be formed on substantially a same plane as an upper surface of the third nanowire 113, which is an uppermost nanowire on the first lower pattern 101.

The second source/drain region 152 may be disposed between the second gate structure 130 and the third pin-cut gate structure 130_1, and between the second gate structure 130 and the fourth pin-cut gate structure 130_2, respectively. The second source/drain region 152 may be disposed on the second lower pattern 102. The second source/drain region 152 may be in direct contact with the fourth to sixth nanowires 114, 115, 116, respectively.

An upper surface of the second source/drain region 152 may be formed on a same plane substantially as an upper surface of the sixth nanowire 116, which is an uppermost nanowire on the second lower pattern 102.

The first inner spacer 141 may be disposed on at least one side of the first gate electrode 121 between the first lower pattern 101 and the first nanowire 111. The first inner spacer 141 may be disposed on at least one side of the first gate electrode 121 between the first nanowire 111 and the second nanowire 112. The first inner spacer 141 may be disposed on at least one side of the first gate electrode 121 between the second nanowire 112 and the third nanowire 113.

The first inner spacer 141 may be disposed between the first gate electrode 121 and the first source/drain region 151 which are included in the first gate structure 120. The first inner spacer 141 may be disposed between the first gate electrode 121 and the first source/drain region 151 which are included in the first pin-cut gate structure 120_1. The first inner spacer 141 may be disposed between the first gate electrode 121 and the first source/drain region 151 which are included in the second pin-cut gate structure 120_2.

The first inner spacer 141 may have a quadrilateral shape where both sidewalls are formed to be curved surface. Thus, each of a sidewall of the first inner spacer 141 in contact with the first source/drain region 151 and a sidewall of the first inner spacer 141 in contact with the first gate insulating film 122 may be formed to be curved surface.

The second inner spacer 142 may be disposed on at least one side of the second gate electrode 131 between the second lower pattern 102 and the fourth nanowire 114. The second inner spacer 142 may be disposed on at least one side of the second gate electrode 131 between the fourth nanowire 114 and the fifth nanowire 115. The second inner spacer 142 may be disposed on at least one side of the second gate electrode 131 between the fifth nanowire 115 and the sixth nanowire 116.

The second inner spacer 142 may be disposed between the second gate electrode 131 and the second source/drain region 152 which are included in the second gate structure 130. The second inner spacer 142 may be disposed between the second gate electrode 131 and the second source/drain region 152 which are included in the third pin-cut gate structure 130_1. The second inner spacer 142 may be disposed between the second gate electrode 131 and the second source/drain region 152 which are included in the fourth pin-cut gate structure 130_2.

The second inner spacer 142 may have a quadrilateral shape where both sidewalls are formed to be curved surface. Thus, each of a sidewall of the second inner spacer 142 in contact with the second source/drain region 152 and a sidewall of the second inner spacer 142 in contact with the second gate insulating film 132 may be formed to be curved surface.

The first inner spacer 141 and the second inner spacer 142 may have different properties from each other. For example, in the first inner spacer 141 and the second inner spacer 142, at least one of a hydrogen mole fraction and an oxygen mole fraction may be different. A "mole fraction" expressed herein indicates a mole ratio of a certain component with respect to entire components in a material system including two or more components. For example, 10% content of a first material may indicate that a mole ratio of the first material with respect to a mole number of entire components is 1/10.

According to an example embodiment, an oxygen mole fraction included in each of the first inner spacer 141 and the second inner spacer 142 may be same as each other, and a hydrogen mole fraction included in each of the first inner spacer 141 and the second inner spacer 142 may be different from each other. For example, the first inner spacer 141 may include hydrogen having a first hydrogen mole fraction, and the second inner spacer 142 may include hydrogen having a second hydrogen mole fraction that is greater than a first hydrogen mole fraction. In this case, for example, a first hydrogen mole fraction may be 2% to 5%, and a second hydrogen mole fraction may be 5% to 10%.

According to another example embodiment, a first oxygen mole fraction of oxygen included in the first inner spacer 141 and a second oxygen mole fraction of oxygen included in the second inner spacer 142 may be different from each other.

According to an example embodiment, a hydrogen mole fraction included in each of the first inner spacer 141 and the second inner spacer 142 may be same as each other, and an oxygen mole fraction included in each of the first inner spacer 141 and the second inner spacer 142 may be different from each other. For example, the first inner spacer 141 may include a first oxygen mole fraction of oxygen, and the second inner spacer 142 may include a second oxygen mole fraction that is greater than a first oxygen mole fraction. In this case, for example, a first oxygen mole fraction may be 2% to 5%, and a second oxygen mole fraction may be 5% to 10%.

According to another example embodiment, a first hydrogen mole fraction of hydrogen included in the first inner spacer 141 and a second hydrogen mole fraction of hydrogen included in the second inner spacer 142 may be different from each other. Thus, the first inner spacer 141 may include a first oxygen mole fraction of oxygen and a first hydrogen mole fraction of hydrogen, and the second inner spacer 142 may include a second oxygen mole fraction of oxygen that is greater than a first oxygen mole fraction, and a second hydrogen mole fraction of hydrogen that is greater than a first hydrogen mole fraction.

The thickness in the first direction X in each of the first inner spacer 141 and the second inner spacer 142, which are disposed on a same level, may be same as each other. For example, a first thickness t1 in the first direction X of the first inner spacer 141 disposed between the first nanowire 11 and the second nanowire 112 may be same as a second thickness t2 in the first direction X of the second inner spacer 142 disposed between the fourth nanowire 114 and the fifth nanowire 115. In an example embodiment, a thickness in the first direction X of the first inner spacer 141 may be 3 nm to 5 nm, and a thickness in the first direction X of the second inner spacer 142 may be 2 nm to 4 nm.

A first hydrogen mole fraction, a first oxygen mole fraction, and a thickness in the first direction X with respect to the first inner spacer 141 may be adjusted co-operatively so as to adjust a threshold voltage of the NMOS transistor formed in the first region I of the substrate 100. Similarly, a second hydrogen mole fraction, a second oxygen mole fraction, and a thickness in the first direction X with respect to the second inner spacer 142 may be adjusted co-operatively so as to adjust a threshold voltage of the PMOS transistor formed in the second region II of the substrate 100.

The first inner spacer 141 and the second inner spacer 142 may include different materials from each other. For example, the first inner spacer 141 may include SiN, and the second inner spacer 142 may include SiON. According to another example embodiment, the first inner spacer 141 and the second inner spacer 142 may include a same material as each other. For example, each of the first inner spacer 141 and the second inner spacer 142 may include SiN. Further, for example, each of the first inner spacer 141 and the second inner spacer 142 may include SiON.

An etch stop film 161 may be disposed along an external sidewall of the first outer spacer 124, an external sidewall of the second outer spacer 134, and an upper surface of the device isolation film 105. The etch stop film 161 may include, for example, any one of silicon nitride (SiN), silicon oxynitride (SiON), silicon oxide ($SiO_2$), silicon oxycarbonitride (SiOCN), and a combination thereof. The etch stop film 161 may include a material having etch selectivity to the first interlayer insulating film 162, which will be described hereinbelow.

The first interlayer insulating film 162 may be disposed on the etch stop film 161. The first interlayer insulating film 162 may surround sidewalls of the first outer spacer 124 and the second outer spacer 134. The first interlayer insulating film 162 may include, for example, at least one of silicon oxide, silicon nitride, and silicon oxynitride.

The second interlayer insulating film 170 may be disposed on the first interlayer insulating film 162. The second interlayer insulating film 170 may cover the first gate structure 120, the first pin-cut gate structure 120_1, the second pin-cut gate structure 120_2, the second gate structure 130, the third pin-cut gate structure 1301, and the fourth pin-cut gate structure 130_2. The second interlayer insulating film 170 may include, for example, at least one of silicon oxide, silicon nitride, and silicon oxynitride.

The first source/drain contact 181 and the second source/drain contact 182 may be disposed within the second interlayer insulating film 170 and the first interlayer insulating film 162.

The first source/drain contact 181 may extend within the first source/drain region 151 on the first lower pattern 101. The first source/drain contact 181 may extend, for example, to a same level as that of the second nanowire 112.

The second source/drain contact 182 may extend within the second source/drain region 152 on the second lower pattern 102. The second source/drain contact 182 may extend, for example, to a same level as that of the fifth nanowire 115.

The first silicide film 191 may be disposed between the first source/drain contact 181 and the first source/drain region 151. The second silicide film 192 may be disposed between the second source/drain contact 182 and the second source/drain region 152.

The semiconductor device according to an example embodiment may enhance reliability of the semiconductor device by adjusting a property of the first inner spacer 141 disposed on the NMOS region and a property of the second inner spacer 142 disposed on the PMOS region and efficiently forming threshold voltage shift between a threshold voltage of the NMOS transistor and a threshold voltage of the PMOS transistor.

Figure 5:
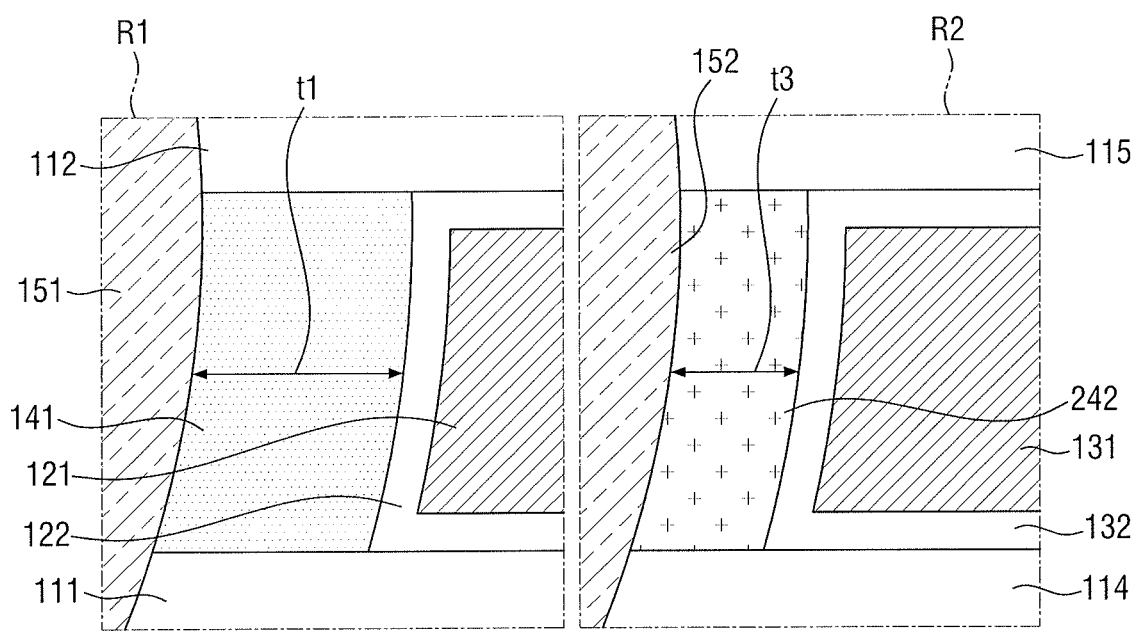
FIG. 5 illustrates an enlarged view of a region R1 and a region R2 of FIG. 2 according to another example embodiment.

Hereinbelow, a semiconductor device according to another example embodiment will be described with reference to FIG. 5. The difference from the semiconductor device illustrated in FIG. 4 will be highlighted. FIG. 5 is an enlarged view of a region R1 and a region R2 of FIG. 2 according to another example embodiment.

Referring to FIG. 5, in the semiconductor device according to another example embodiment, a first thickness t1 in the first direction X of the first inner spacer 141 disposed on the first lower pattern 101 may be greater than a third thickness t3 in the first direction X of the second inner spacer 242 disposed on the second lower pattern 102.

Hereinbelow, a semiconductor device according to another example embodiment will be described with reference to FIG. 6. The difference from the semiconductor device illustrated in FIG. 4 will be highlighted. FIG. 6 is an enlarged view of a region R1 and a region R2 of FIG. 2 according to another example embodiment.

Referring to FIG. 6, in the semiconductor device according to another example embodiment, a first inner spacer 341 disposed on the first lower pattern 101 may be formed to be convex toward the first gate electrode 121. Further, the second inner spacer 342 disposed on the second lower pattern 102 may be formed to be convex toward the second gate electrode 131. Herein, convex formation indicates that a sidewall has a curved surface shape entirely.

Figure 7:
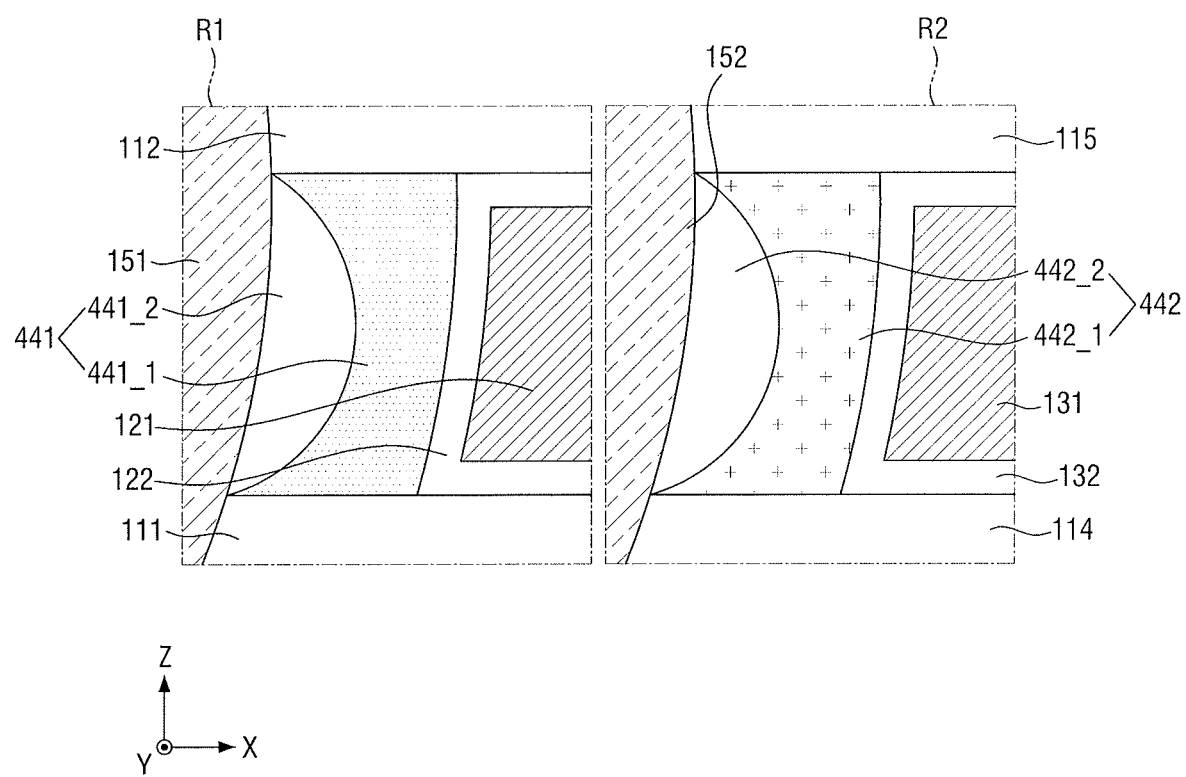
FIG. 7 illustrates an enlarged view of a region R1 and a region R2 of FIG. 2 according to another example embodiment.

Hereinbelow, a semiconductor device according to another example embodiment will be described with reference to FIG. 7. The difference from the semiconductor device illustrated in FIG. 4 will be highlighted. FIG. 7 is an enlarged view of a region R1 and a region R2 of FIG. 2 according to another example embodiment.

Referring to FIG. 7, in the semiconductor device according to another example embodiment, each of an inner spacer 441 disposed on the first lower pattern 101 and an inner spacer 442 disposed on the second lower pattern 102 may be formed to be a multi-layered film.

For example, the inner spacer 441 may include a first inner spacer 441_1 in contact with the first gate insulating film 122 and a third inner spacer 441_2 disposed between the first inner spacer 441_1 and the first source/drain region 151.

An upper surface of the first inner spacer 441_1 may be in contact with the second nanowire 112, and a lower surface of the first inner spacer 441_1 may be in contact with the first nanowire 111. The third inner spacer 441_2 may be formed to be convex toward the first inner spacer 441_1.

For example, the inner spacer 442 may include a second inner spacer 442_1 in contact with the second gate insulating film 132 and a fourth inner spacer 442_2 disposed between the second inner spacer 442_1 and the second source/drain region 152.

An upper surface of the second inner spacer 442_1 may be in contact with the fifth nanowire 115, and a lower surface of the second inner spacer 442_1 may be in contact with the fourth nanowire 114. The fourth inner spacer 442_2 may be formed to be convex toward the second inner spacer 442_1.

The first inner spacer 441_1 and the second inner spacer 442_1 may have different properties from each other. The third inner spacer 441_2 and the fourth inner spacer 442_2 may have a same property.

The first inner spacer 441_1 and the second inner spacer 442_1 may include another material than those of the third inner spacer 441_2 and the fourth inner spacer 442_2. For example, each of the first inner spacer 441_1 and the second inner spacer 442_1 may include SiON, and each of the third inner spacer 441_2 and the fourth inner spacer 442_2 may include SiN.

Figure 8:
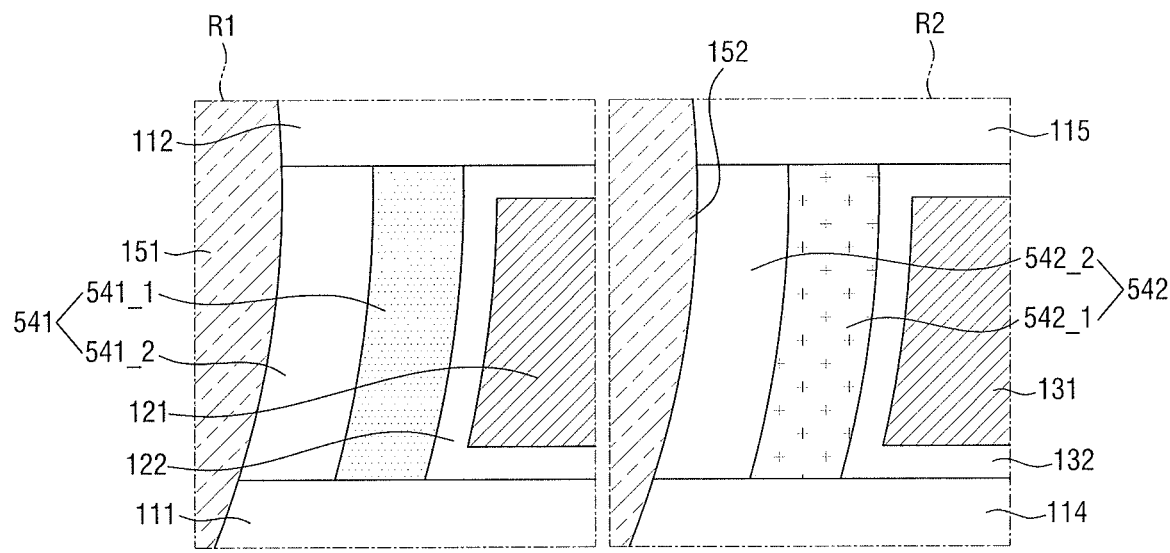
FIG. 8 illustrates an enlarged view of a region R1 and a region R2 of FIG. 2 according to another example embodiment.

Hereinbelow, a semiconductor device according to another example embodiment will be described with reference to FIG. 8. The difference from the semiconductor device illustrated in FIG. 4 will be highlighted. FIG. 8 is an enlarged view of a region R1 and a region R2 of FIG. 2 according to another example embodiment.

Referring to FIG. 8, in the semiconductor device according to another example embodiment, each of an inner spacer 541 disposed on the first lower pattern 101 and an inner spacer 542 disposed on the second lower pattern 102 may be formed to be a multi-layered film.

For example, the inner spacer 541 may include a first inner spacer 541_1 in contact with the first gate insulating film 122 and a third inner spacer 541_2 disposed between the first inner spacer 541_1 and the first source/drain region 151.

An upper surface of the first inner spacer 541_1 may be in contact with the second nanowire 112, and a lower surface of the first inner spacer 541_1 may be in contact with the first nanowire 11l. An upper surface of the third inner spacer 541_2 may be in contact with the second nanowire 112, and a lower surface of the third inner spacer 541_2 may be in contact with the first nanowire 111.

The inner spacer 542 may include, for example, a second inner spacer 542_1 in contact with the second gate insulating film 132 and a fourth inner spacer 542_2 disposed between the second inner spacer 542_1 and the second source/drain region 152.

An upper surface of the second inner spacer 542_1 may be in contact with the fifth nanowire 115, and a lower surface of the second inner spacer 542_1 may be in contact with the fourth nanowire 114. An upper surface of the fourth inner spacer 542_2 may be in contact with the fifth nanowire 115, and a lower surface of the fourth inner spacer 5422 may be in contact with the fourth nanowire 114.

The first inner spacer 541_1 and the second inner spacer 542_1 may have different properties from each other. The third inner spacer 541_2 and the fourth inner spacer 542_2 may have a same property. For example, the first inner spacer 541_1 and the second inner spacer 542_1 may include materials different from those of the third inner spacer 541_2 and the fourth inner spacer 542_2.

Figure 9:
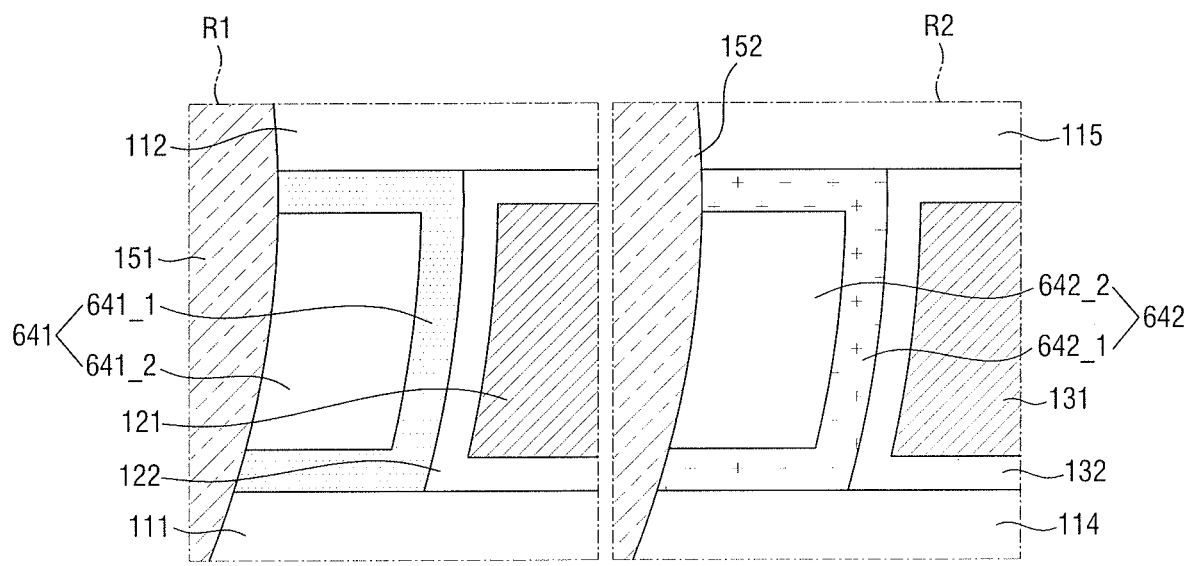
FIG. 9 illustrates an enlarged view of a region R1 and a region R2 of FIG. 2 according to another example embodiment.

Hereinbelow, a semiconductor device according to another example embodiment will be described with reference to FIG. 9. The difference from the semiconductor device illustrated in FIG. 4 will be highlighted. FIG. 9 is an enlarged view of a region R1 and a region R2 of FIG. 2 according to another example embodiment.

Referring to FIG. 9, in the semiconductor device according to another example embodiment, each of an inner spacer 641 disposed on the first lower pattern 101 and an inner spacer 642 disposed on the second lower pattern 102 may be formed to be a multi-layered film.

For example, the inner spacer 641 may include a first inner spacer 641_1 in contact with the first gate insulating film 122 and a third inner spacer 641_2 disposed between the first inner spacer 641_1 and the first source/drain region 151.

The first inner spacer 641_1 may be disposed conformally along the first gate insulating film 122, an upper surface of the first nanowire 111, and a lower surface of the second nanowire 112.

For example, the inner spacer 642 may include a second inner spacer 6421 in contact with the second gate insulating film 132 and a fourth inner spacer 642_2 disposed between the second inner spacer 642_1 and the second source/drain region 152.

The second inner spacer 642_1 may be disposed conformally along the second gate insulating film 132, an upper surface of the fourth nanowire 114, and a lower surface of the fifth nanowire 115.

The first inner spacer 641_1 and the second inner spacer 642_1 may have different properties from each other. The third inner spacer 641_2 and the fourth inner spacer 642_2 may have a same property. For example, the first inner spacer 641_1 and the second inner spacer 642_1 may have different materials from those of the third inner spacer 641_2 and the fourth inner spacer 642_2.

Figure 10:
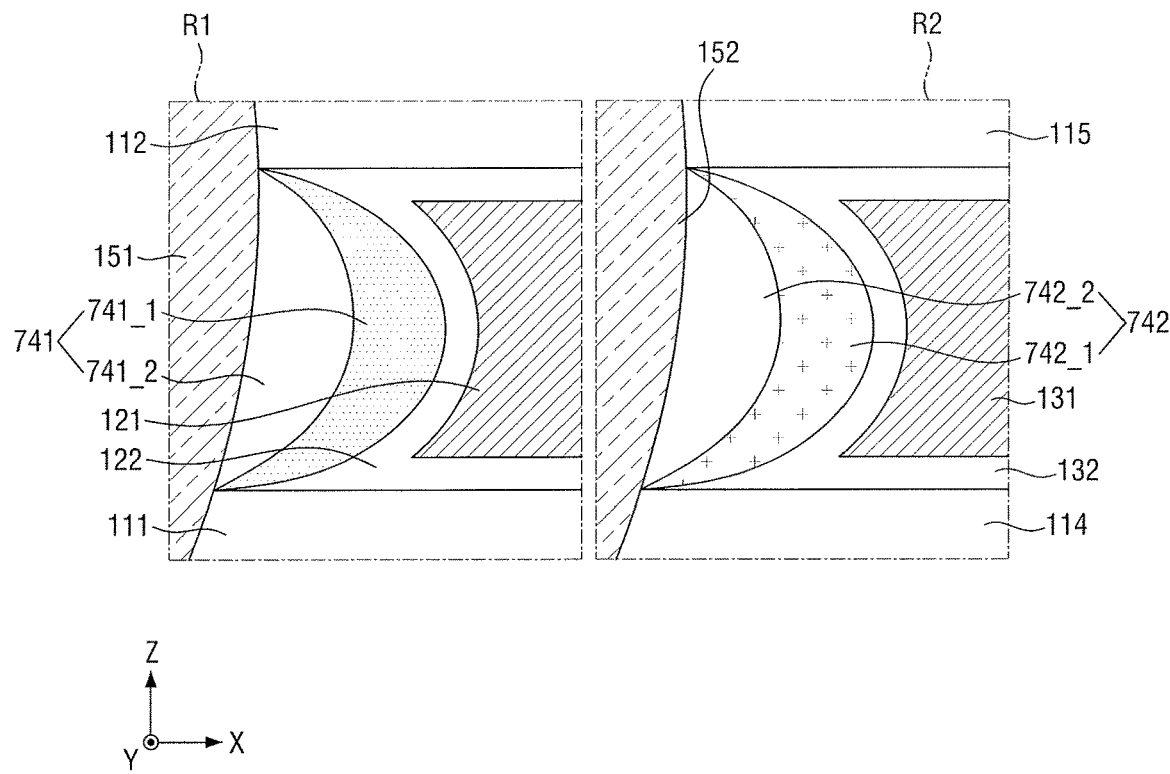
FIG. 10 illustrates an enlarged view of a region R1 and a region R2 of FIG. 2 according to another example embodiment.

Hereinbelow, a semiconductor device according to another example embodiment will be described with reference to FIG. 10. The difference from the semiconductor device illustrated in FIG. 4 will be highlighted. FIG. 10 is an enlarged view of a region R1 and a region R2 of FIG. 2 according to another example embodiment.

Referring to FIG. 10, in the semiconductor device according to another example embodiment, each of an inner spacer 741 disposed on the first lower pattern 101 and an inner spacer 742 disposed on the second lower pattern 102 may be formed to be a multi-layered film.

For example, the inner spacer 741 may include a first inner spacer 741_1 in contact with the first gate insulating film 122 and a third inner spacer 741_2 disposed between the first inner spacer 741_1 and the first source/drain region 151. Each of the first inner spacer 741_1 and the third inner spacer 741_2 may be formed to be convex toward the first gate electrode 121.

For example, the inner spacer 742 may include a second inner spacer 7421 in contact with the second gate insulating film 132 and a fourth inner spacer 742_2 disposed between the second inner spacer 742_1 and the second source/drain region 152. Each of the second inner spacer 742_1 and the fourth inner spacer 742_2 may be formed to be convex toward the second gate electrode 131.

The first inner spacer 741_1 and the second inner spacer 742_1 may have different properties from each other. The third inner spacer 741_2 and the fourth inner spacer 742_2 may have a same property. For example, the first inner spacer 741_1 and the second inner spacer 742_1 may have different materials from those of the third inner spacer 741_2 and the fourth inner spacer 742_2.

Figure 11:
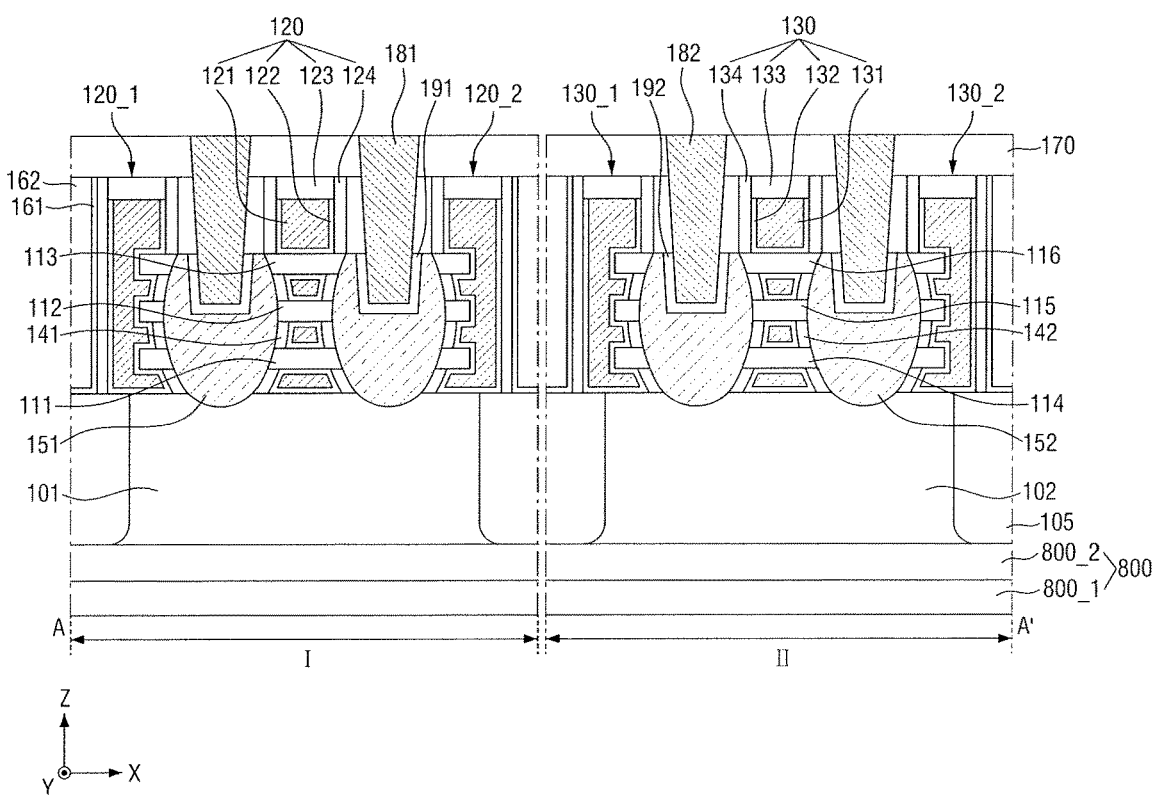
FIG. 11 illustrates a cross-sectional view of a semiconductor device according to another example embodiment.

Hereinbelow, a semiconductor device according to another example embodiment will be described with reference to FIG. 11. The difference from the semiconductor device illustrated in FIG. 2 will be highlighted. FIG. 11 is a cross-sectional view of a semiconductor device according to another example embodiment.

Referring to FIG. 11, in the semiconductor device according to another example embodiment, a substrate 800 may be a silicon-on-insulator (SOI) substrate. Thus, the substrate 800 may include a silicon layer 800_1 and an insulating layer 800_2 disposed on the silicon layer 800_1. Each of the first lower pattern 101 and the second lower pattern 102 may be disposed on the insulating layer 800_2. The insulating layer 800_2 may include, for example, silicon oxide ($SiO_2$). The silicon layer 800_1 may be, for example, a silicon substrate.

Figure 12:
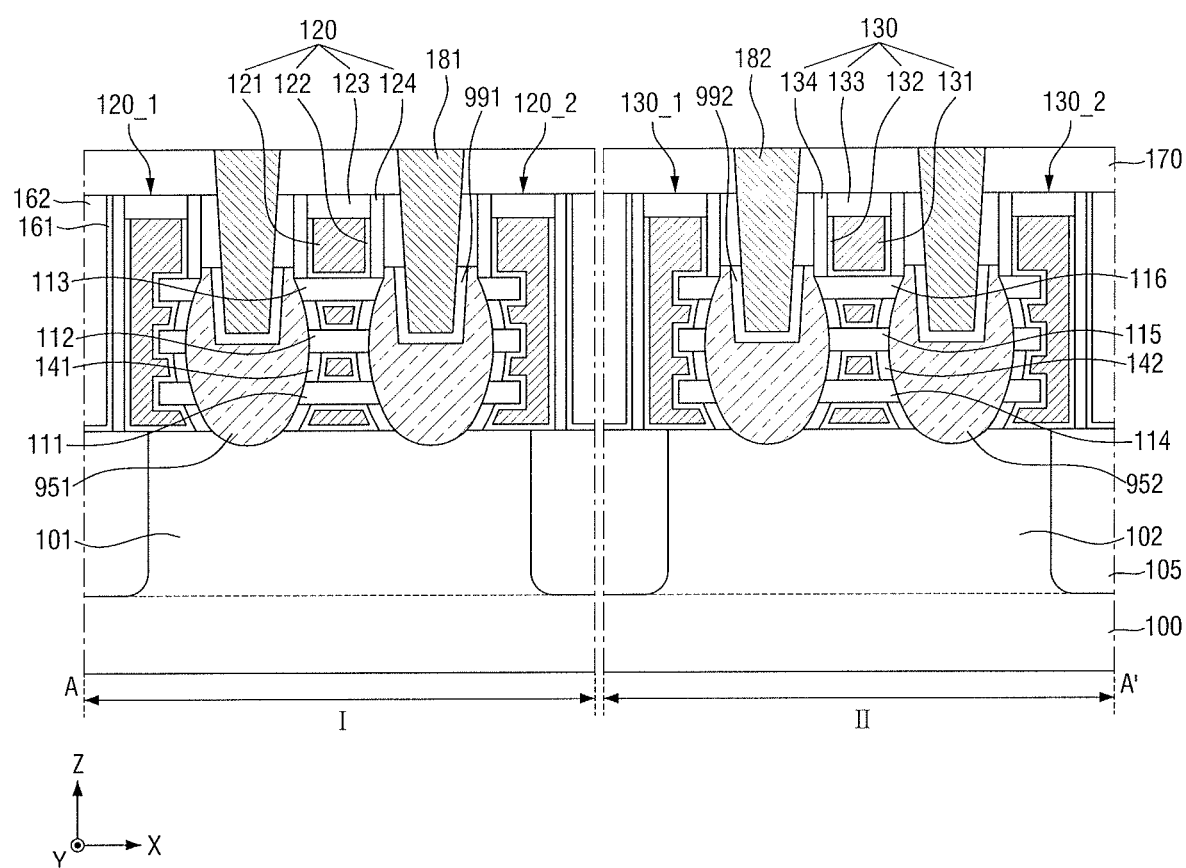
FIG. 12 illustrates a cross-sectional view of a semiconductor device according to another example embodiment.

Hereinbelow, a semiconductor device according to another example embodiment will be described with reference to FIG. 12. The difference from the semiconductor device illustrated in FIG. 2 will be highlighted. FIG. 12 is a cross-sectional view of a semiconductor device according to another example embodiment.

Referring to FIG. 12, in the semiconductor device according to another example embodiment, an upper surface of the first source/drain region 951 may be formed to be higher than an upper surface of the third nanowire 113 which is an uppermost nanowire on the first lower pattern 101. Further, an upper surface of the second source/drain region 952 may be formed to be higher than an upper surface of the sixth nanowire 116 which is an uppermost nanowire on the second lower pattern 102.

An upper surface of a first silicide film 991 may be formed to be higher than an upper surface of the third nanowire 113. An upper surface of a second silicide film 992 may be formed to be higher than an upper surface of the sixth nanowire 116.

Figure 13:
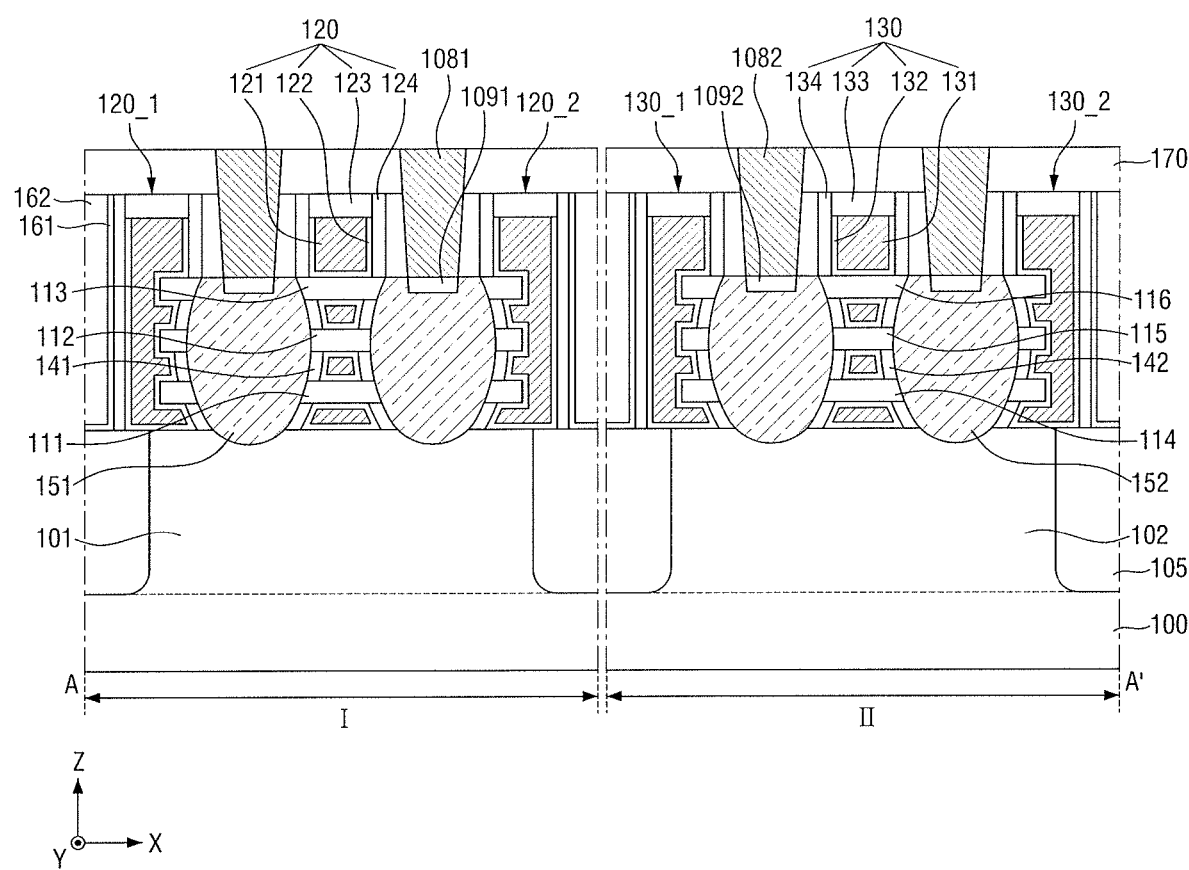
FIG. 13 illustrates a cross-sectional view of a semiconductor device according to another example embodiment.

Hereinbelow, a semiconductor device according to another example embodiment will be described with reference to FIG. 13. The difference from the semiconductor device illustrated in FIG. 2 will be highlighted. FIG. 13 is a cross-sectional view of a semiconductor device according to another example embodiment.

Referring to FIG. 13, in the semiconductor device according to another example embodiment, a first source/drain contact 1081 may not extend within the first source/drain region 151. Thus, the first source/drain contact 1081 may be disposed on an upper surface of the first source/drain region 151. Further, a second source/drain contact 1082 may not extend within the second source/drain region 152. Thus, the second source/drain contact 1082 may be disposed on an upper surface of the second source/drain region 152.

A first silicide film 1091 may be disposed between the first source/drain contact 1081 and the first source/drain region 151. A second silicide film 1092 may be disposed between the second source/drain contact 1082 and the second source/drain region 152.

Figure 14:
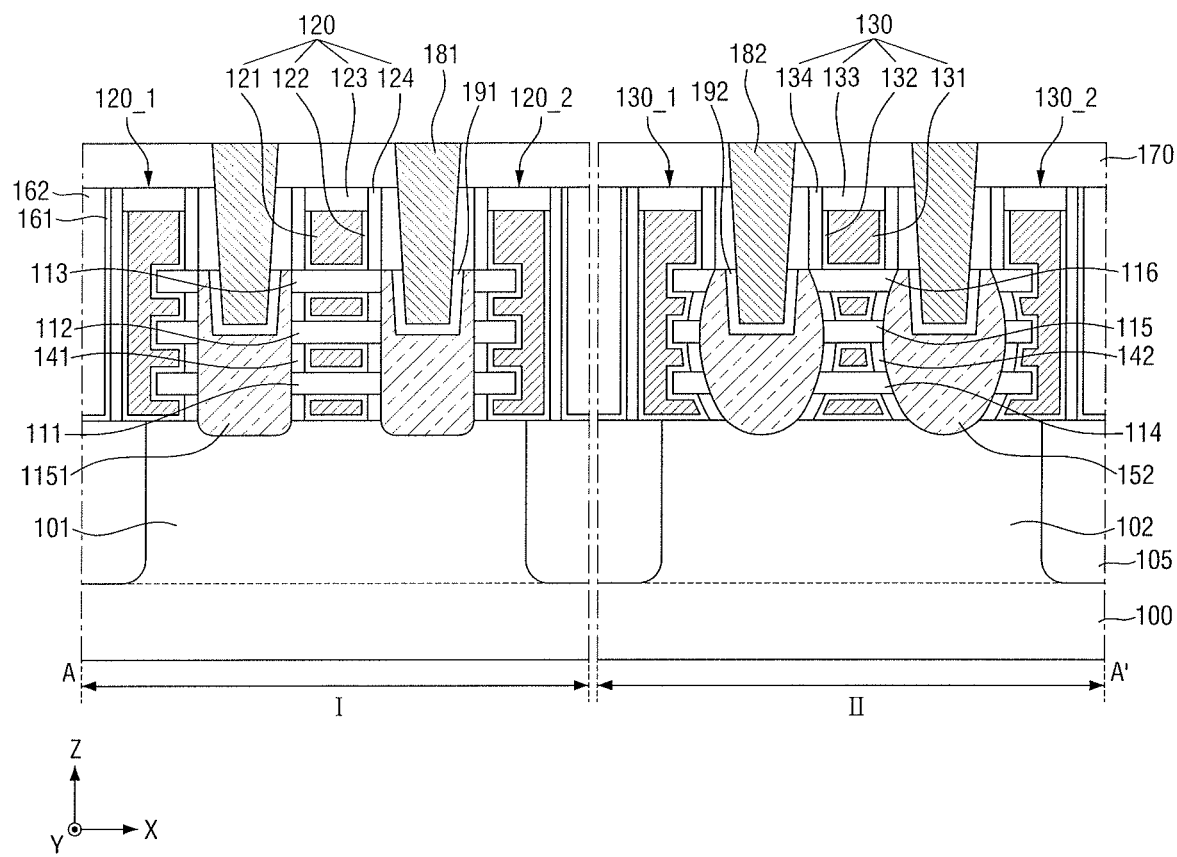
FIG. 14 illustrates a cross-sectional view of a semiconductor device according to another example embodiment.

Hereinbelow, a semiconductor device according to another example embodiment will be described with reference to FIG. 14. The difference from the semiconductor device illustrated in FIG. 2 will be highlighted. FIG. 14 is a cross-sectional view of a semiconductor device according to another example embodiment.

Referring to FIG. 14, in the semiconductor device according to another example embodiment, a sidewall of a first source/drain region 1151 in contact with the first to third nanowires 111, 112, 113 may extend in the third direction Z so as to have a certain slope profile.

Lengths in the first direction X with respect to each of the first to third nanowires 111, 112, 113 disposed between the first source/drain regions 1151 may be same as one another.

Figure 15:
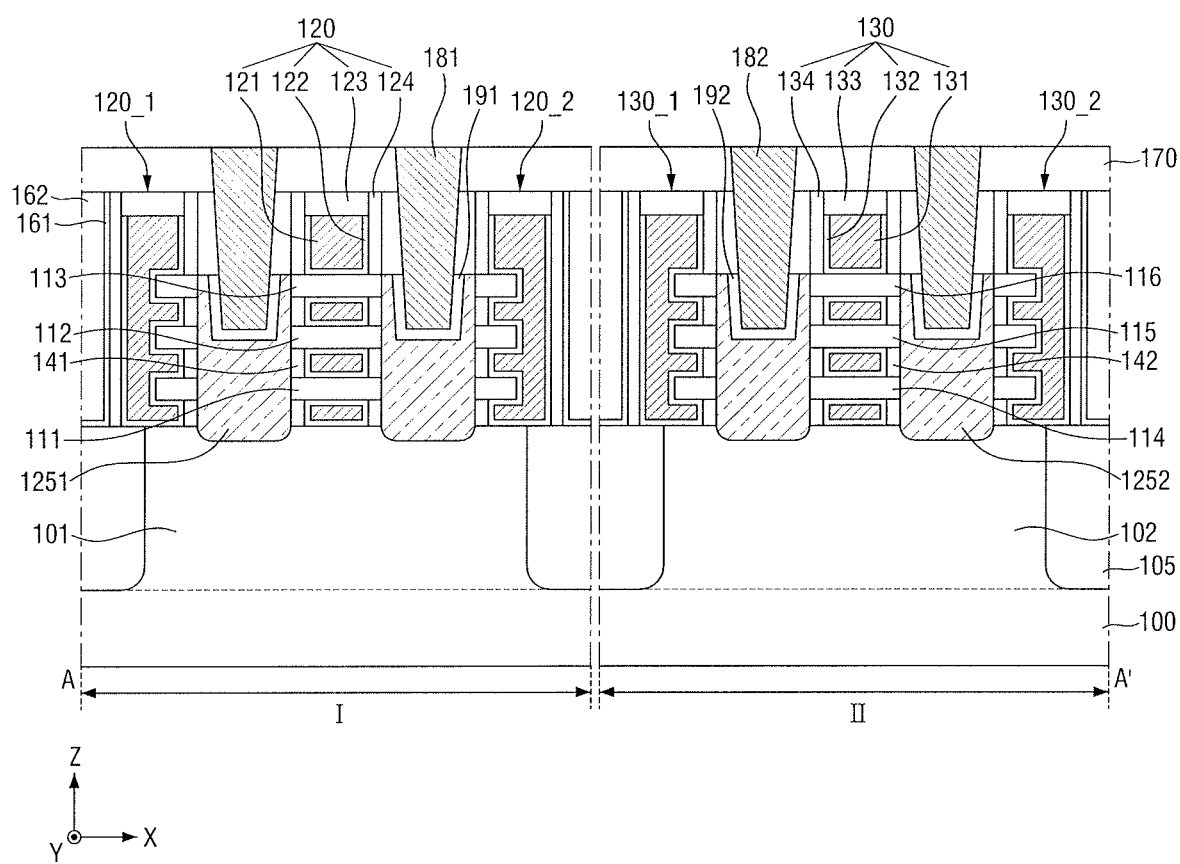
FIG. 15 illustrates a cross-sectional view of a semiconductor device according to another example embodiment.

Hereinbelow, a semiconductor device according to another example embodiment will be described with reference to FIG. 15. The difference from the semiconductor device illustrated in FIG. 2 will be highlighted. FIG. 15 is a cross-sectional view of a semiconductor device according to another example embodiment.

Referring to FIG. 15, in the semiconductor device according to another example embodiment, a sidewall of a first source/drain region 1251 in contact with the first to third nanowires 111, 112, 113 may extend in the third direction Z so as to have a certain slope profile. Further, a sidewall of a second source/drain region 1252 in contact with the fourth to sixth nanowires 114, 115, 116 may extend in the third direction Z so as to have a certain slope profile.

Lengths in the first direction X with respect to each of the first to third nanowires 111, 112, 113 disposed between the first source/drain regions 1251 may be same as one another. Further, lengths in the first direction X with respect to each of the fourth to sixth nanowires 114, 115, 116 disposed between the second source/drain regions 1252 may be same as one another.

As described above, embodiments relate to a semiconductor device including a multi-bridge channel field effect transistor (MBCFET™).

Embodiments may provide a semiconductor device with enhanced reliability by adjusting a property of an inner spacer disposed in an NMOS region and a property of an inner spacer disposed on a PMOS region, and effectively forming threshold voltage shift between a threshold voltage of an NMOS transistor and a threshold voltage of a PMOS transistor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate having a first region and a second region;
first and second nanowires disposed sequentially on the substrate in the first region, and extending respectively in a first direction;
third and fourth nanowires disposed sequentially on the substrate in the second region, and extending respectively in the first direction;
a first inner spacer between the first nanowire and the second nanowire, and including hydrogen of a first hydrogen mole fraction; and
a second inner spacer between the third nanowire and the fourth nanowire, and including hydrogen of a second hydrogen mole fraction that is greater than the first hydrogen mole fraction.

2. The semiconductor device of claim 1, wherein:
the first inner spacer includes oxygen of a first oxygen mole fraction, and
the second inner spacer includes oxygen of a second oxygen mole fraction that is greater than the first oxygen mole fraction.

3. The semiconductor device of claim 1, wherein:
the first inner spacer and the second inner spacer are disposed at a same level, and
a first thickness in the first direction of the first inner spacer is greater than a second thickness in the first direction of the second inner spacer.

4. The semiconductor device of claim 3, wherein:
the first thickness of the first inner spacer is 3 nm to 5 nm, and
the second thickness of the second inner spacer is 2 nm to 4 nm.

5. The semiconductor device of claim 1, wherein the first inner spacer and the second inner spacer include different materials from each other.

6. The semiconductor device of claim 5, wherein the first inner spacer includes SiN and the second inner spacer includes SiON.

7. The semiconductor device of claim 1, further comprising:
a third inner spacer on the first inner spacer between the first nanowire and the second nanowire, and
a fourth inner spacer on the second inner spacer between the third nanowire and the fourth nanowire.

8. The semiconductor device of claim 7, wherein the first and second inner spacers include different materials from those of the third and fourth inner spacers.

9. The semiconductor device of claim 8, wherein:
each of the first and second inner spacers includes SiON, and
each of the third and fourth inner spacers includes SiN.

10. The semiconductor device of claim 1, further comprising:
a first gate electrode surrounding the first and second nanowires and extending in a second direction different from the first direction, and
a second gate electrode surrounding the third and fourth nanowires and extending in the second direction.

11. The semiconductor device of claim 1, wherein a threshold voltage of the first region is different from a threshold voltage of the second region.

12. A semiconductor device, comprising:
a substrate having a first region and a second region;
first and second nanowires disposed sequentially on the substrate in the first region and extending respectively in a first direction;
third and fourth nanowires disposed sequentially on the substrate in the second region and extending respectively in the first direction;
a first gate electrode surrounding the first and second nanowires and extending in a second direction different from the first direction;
a second gate electrode surrounding the third and fourth nanowires and extending in the second direction;
a first inner spacer on at least one side of the first gate electrode between the first nanowire and the second nanowire, and including oxygen of a first oxygen mole fraction; and
a second inner spacer on at least one side of the second gate electrode between the third nanowire and the fourth nanowire, and including oxygen of a second oxygen mole fraction that is greater than the first oxygen mole fraction.

13. The semiconductor device of claim 12, wherein:
the first inner spacer includes hydrogen of a first hydrogen mole fraction, and
the second inner spacer includes hydrogen of a second hydrogen mole fraction that is greater than the first hydrogen mole fraction.

14. The semiconductor device of claim 12, wherein:
the first inner spacer and the second inner spacer are disposed at a same level, and
a first thickness in the first direction of the first inner spacer is greater than a second thickness in the first direction of the second inner spacer.

15. The semiconductor device of claim 12, wherein the first inner spacer and the second inner spacer include a same material.

16. The semiconductor device of claim 12, further comprising:
a third inner spacer on the first inner spacer between the first nanowire and the second nanowire, and
a fourth inner spacer on the second inner spacer between the third nanowire and the fourth nanowire.

17. A semiconductor device, comprising:
a substrate having a first region and a second region;
first to third nanowires disposed sequentially on the substrate in the first region and extending respectively in a first direction;

fourth to sixth nanowires disposed sequentially on the substrate in the second region and extending respectively in the first direction;
a first gate electrode surrounding the first to third nanowires and extending in a second direction different from the first direction;
a second gate electrode surrounding the fourth to sixth nanowires and extending in the second direction;
a first source/drain region on at least one side of the first to third nanowires;
a second source/drain region on at least one side of the fourth to sixth nanowires;
a first inner spacer on at least one side of the first gate electrode between the first nanowire and the second nanowire, and including oxygen of a first oxygen mole fraction and hydrogen of a first hydrogen mole fraction;
a second inner spacer on at least one side of the second gate electrode between the fourth nanowire and the fifth nanowire, and including oxygen of a second oxygen mole fraction that is greater than the first oxygen mole fraction, and hydrogen of a second hydrogen mole fraction that is greater than the first hydrogen mole fraction;
a first source/drain contact connected with the first source/drain region; and
a second source/drain contact connected with the second source/drain region.

18. The semiconductor device of claim 17, further comprising:
a third inner spacer on the first inner spacer between the first nanowire and the second nanowire, and
a fourth inner spacer on the second inner spacer between the fourth nanowire and the fifth nanowire.

19. The semiconductor device of claim 17, wherein the first inner spacer includes SiN, and the second inner spacer includes SiON.

20. The semiconductor device of claim 17, wherein each of the first inner spacer and the second inner spacer includes SiON.

* * * * *